United States Patent
Nilsson

(10) Patent No.: US 7,941,093 B2
(45) Date of Patent: May 10, 2011

(54) SPURIOUS-FREE FLEXIBLE FREQUENCY CONVERTER AND A SATELLITE COMMUNICATION REPEATER ARCHITECTURE

(75) Inventor: Jörgen Nilsson, Mölndal (SE)

(73) Assignee: RUAG Space AB, Göteborg (SE)

( * ) Notice: Subject to any disclaimer, the term of this patent is extended or adjusted under 35 U.S.C. 154(b) by 496 days.

(21) Appl. No.: 12/143,166

(22) Filed: Jun. 20, 2008

(65) Prior Publication Data

US 2008/0318522 A1 Dec. 25, 2008

(30) Foreign Application Priority Data

Jun. 20, 2007 (EP) .................................... 07110640

(51) Int. Cl.
| | |
|---|---|
| H04B 1/00 | (2006.01) |
| H04B 17/00 | (2006.01) |
| H04B 1/10 | (2006.01) |
| H04B 15/00 | (2006.01) |
| H04B 1/26 | (2006.01) |
| H04B 1/18 | (2006.01) |

(52) U.S. Cl. ...... 455/20; 455/63.1; 455/67.13; 455/296; 455/315; 455/310; 455/311; 455/317; 455/283

(58) Field of Classification Search ................. 455/63.1, 455/67.13, 296, 315, 310–311, 317, 283, 455/196.1, 150.1, 295, 313
See application file for complete search history.

(56) References Cited

U.S. PATENT DOCUMENTS

| | | | |
|---|---|---|---|
| 5,794,131 A | 8/1998 | Cairns | |
| 6,876,839 B2 | 4/2005 | Harris | |
| 6,968,173 B2 * | 11/2005 | Cowley | 455/323 |
| 6,973,121 B1 | 12/2005 | Eberlein et al. | |
| 6,980,589 B1 * | 12/2005 | Babb et al. | 375/222 |
| 7,003,274 B1 | 2/2006 | Olip | |
| 7,076,226 B2 * | 7/2006 | Bult et al. | 455/252.1 |
| 7,613,430 B1 * | 11/2009 | Mack | 455/76 |
| 7,782,850 B2 * | 8/2010 | Kliger et al. | 370/389 |
| 7,783,259 B2 * | 8/2010 | Dessert et al. | 455/63.1 |
| 2005/0089119 A1 * | 4/2005 | Miyagi | 375/316 |
| 2005/0160475 A1 * | 7/2005 | Waight et al. | 725/151 |
| 2005/0260961 A1 * | 11/2005 | Cowley et al. | 455/191.1 |
| 2006/0068708 A1 * | 3/2006 | Dessert et al. | 455/63.1 |
| 2008/0318522 A1 * | 12/2008 | Nilsson | 455/12.1 |
| 2010/0244903 A1 * | 9/2010 | Easton et al. | 327/105 |

FOREIGN PATENT DOCUMENTS

| | | |
|---|---|---|
| EP | 0712104 A2 | 5/1996 |
| EP | 1172940 A2 | 1/2002 |

OTHER PUBLICATIONS

European Search Report—Mar. 27, 2008.

* cited by examiner

*Primary Examiner* — Matthew D. Anderson
*Assistant Examiner* — Bobbak Safaipour
(74) *Attorney, Agent, or Firm* — Venable LLP; Eric J. Franklin

(57) ABSTRACT

A method for frequency conversion within a satellite-based repeater system. An uplink radio frequency signal having a frequency $f_{RF}$ is received. A first and at least a second local oscillator signal having frequencies $f_{LO1}$ and $f_{LO2}$, respectively, is generated. The uplink signal is mixed at a first frequency conversion stage with the first local oscillator signal to generate an intermediate signal having a frequency $f_{MF}$. The intermediate signal is mixed at a second frequency conversion stage with the at least second local oscillator signal to generate a downlink signal having a frequency $f_{IF}$. The generation and mixing of the signals are performed such that:

$f_{LO1\ and\ fLO2} > f_{RF}$ and $f_{IF}$ $f_{MF} = f_{LO1} - f_{RF}$, and $f_{IF} = f_{LO2} - f_{MF}$.

6 Claims, 3 Drawing Sheets

SPURIOUS-FREE FLEXIBLE FREQUENCY CONVERTER AND A SATELLITE COMMUNICATION REPEATER ARCHITECTURE

CROSS-REFERENCE TO RELATED APPLICATIONS

This application claims priority to European patent application 07110640.5 filed 20 Jun. 2007.

TECHNICAL FIELD

The present invention relates to a method for frequency conversion within a satellite-based repeater system, a circuit for generating local oscillator signals used in the method, and a satellite-based repeater system including a frequency converter and the circuit.

BACKGROUND ART

The most common method of satellite communication is by the use of so called bent-pipe repeater system. A bent pipe repeater system uses microwave frequency converters, or receivers, for direct conversion from the uplink frequencies to the downlink frequencies. These frequency converters are usually single conversion equipment, which utilize an external or internal fixed local oscillator (LO) frequency. Usually the frequency conversion is either done for a single channel application, or carrier, or more commonly for a block of channels, or multi-carriers. Of course, a channel may consist of one or more sub-channels. Consequently, a carrier may consist of one or more sub-carriers. A carrier is either modulated or un-modulated.

Such repeater systems are limited in flexibility, and do not allow the user/operator to change the frequency of the up- and downlinks for adaptation to new traffic and/or changes in traffic. This limitation can be overcome by using a large number of frequency converters, each having a unique local oscillator frequency, in which case each of these can be addressed by using a switching arrangement. This arrangement is used in most system today. However, such an arrangement directly leads to a couple of drawbacks: the number of frequency converters increases, the switching network employed introduces great signal losses which need to be compensated for by having higher output power capability of said frequency converters and also by having lower noise contribution from channel amplifiers and frequency converters in the satellite payload.

It is possible to replace the fixed local oscillator by a synthesized one, and thus making it possible to address any wanted LO frequency of interest. However, it is not possible to change the local oscillator frequency in an arbitrary fashion due to the generation of unwanted spurious output signals. Harmonics of the LO frequency that will fall within the operating channel bandwidths when employing a single frequency scheme are particularly detrimental to system performance.

These drawbacks have made it technically and economically very difficult to increase the flexibility of a bent-pipe satellite communication repeater system.

EP patent application no. 0 712 104 relates to a multi-channel radio frequency signal transponder system used in communication satellites. The system includes a frequency channel-converter unit for implementing dual frequency conversions. The system down-converts the received RF signals to intermediate frequency signals which are later up-converted to the required transmission frequency signals. The frequencies can be varied using a low phase-noise phase lock loop (PLL).

U.S. Pat. No. 6,973,121 provides a method and system for receiving and transmitting modulated signals using a repeater. Further, the patent discloses how to control the repeater output frequency using modulator and demodulator circuits and a repeater system-based clock. Additionally, a tuner is provided between the repeater system input and demodulator for down-converting the received frequency to the intermediate frequency. Similarly, a tuner is provided between the modulator output and system output for up-converting the frequency to the transmission frequency. The modulator and demodulator circuits comprise numerically-controlled oscillators/PLLs, frequency mixers, and feedback circuits.

However, there is still a need for increasing flexibility with respect to frequency for satellite-based repeater systems without introducing signal degradation that limits the use of the repeater system.

SUMMARY OF THE INVENTION

The problem identified is thus how to achieve flexibility with respect to frequency for satellite-based repeater systems without introducing signal degradation that limits the use of the repeater system, and without introducing redundant equipment increasing the cost and the net weight of the repeater system.

The problem is solved according to the present invention by a method for frequency conversion within a satellite-based repeater system, comprising the steps of:
  receiving an uplink radio frequency signal having a frequency $f_{RF}$;
  generating a first and at least a second local oscillator signal having frequencies $f_{LO1}$ and $f_{LO2}$, respectively;
  at a first frequency conversion stage, mixing said uplink signal with said first local oscillator signal to generate an intermediate signal having a frequency $f_{MF}$;
  at a second frequency conversion stage, mixing said intermediate signal with said at least second local oscillator signal to generate a downlink signal having a frequency $f_{IF}$;
  wherein the generation and mixing of said signals are performed such that:

$f_{LO1}$ and $f_{LO2}$ > $f_{RF}$ and $f_{IF}$ $f_{MF} = f_{LO1} - f_{RF}$, and $f_{IF} = f_{LO2} - f_{MF}$ By generating and mixing the signals so as to obtain the above frequency relations, all unwanted spurious signals that are harmonics of the local oscillator frequencies will be of higher frequency than either of the uplink signal and the downlink signal and can, if needed, be rejected by a simple low pass filter. Hence, a converter scheme employing this method will be spurious free with respect to LO harmonics. As long as these frequency relations are maintained, the local oscillator signals can be varied in an arbitrary fashion, thus allowing a user/operator to change the frequency of the satellite up- and downlinks for adaptation to new traffic and/or changes in traffic.

According to an aspect of the invention, the method for frequency conversion described above is employed for a block conversion application. That is, when the uplink signal comprises a block of channels within a certain bandwidth. In this case, the complete uplink bandwidth is frequency converted using the above described conversion method to a downlink signal using the same bandwidth.

According to another aspect of the invention, the method for frequency conversion is employed for a channel conversion application. Then, a block of channels available at the uplink frequency are down-converted to an intermediate signal by use of a single local oscillator signal whereupon the intermediate signal is split into a plurality of signal paths. The signal in each signal path is filtered by an individually chosen filter to obtain separate intermediate channels at the output of said filters. Each intermediate channel may then be processed separately before being independently up-converted by mixing it with a separate local oscillator signal to generate a desired downlink channel.

Thus, the present invention makes it possible to convert any given uplink channel to any downlink frequency of interest.

The filters performing the multiplexing function in the channel conversion application described above may be included in the frequency converter. This gives the benefit of reducing signal losses otherwise associated with multiplexers and switches since part of the loss is inserted into the frequency converter between the first and second conversion stage where parameters such as Noise Figure and Linearity (amplitude, phase, etc.) can be readily controlled due to the low signal power level used in that location. Furthermore, the outputs of the filters are reduced in bandwidth and usually contain only single channel (or sets of channels) communication, whereby linearity is greatly relaxed. This is of particular importance in multi-carrier/channel applications which require better linearity due to the contribution from more than one carrier.

According to a preferred embodiment of the invention, the step of generating the local oscillator signals comprises the steps of:

generating a low frequency signal with frequency $f_{XOR}$;

providing the low frequency signal as an input signal to:
  i) a fixed PLL loop comprising a fixed high frequency source of frequency $f_{XO1}$ being phase and frequency locked to $f_{XOR}$;
  ii) a first and at least a second programmable PLL loop comprising a first and a second independent synthesized microwave oscillator of frequency $f_{XO2}$ and $f_{XO3}$, respectively, said oscillators being phase and frequency locked to a suitable frequency;

mixing the output signal from the fixed PLL loop with the output signal from the first programmable PLL loop to obtain a first local oscillator signal having a frequency $f_{LO1}=f_{XO1}\pm f_{XO2}$;

mixing the output signal from the fixed PLL loop with the output signal from the at least second programmable PLL loop to obtain at least a second local oscillator signal (LO2) having a frequency $f_{LO2}=f_{XO1}\pm f_{XO3}$.

The synthesized microwave oscillators make it possible to address any wanted local oscillator signal of interest, and since each local oscillator frequency will have phase noise consisting of contributions from the high frequency oscillator and from one low frequency oscillator, the first and the at least second local oscillator signal will contain correlated phase noise. Therefore, it is possible to cancel out most of the phase noise from the local oscillator signals by employing the conversion method with two conversion stages described above.

The present invention also provides a local oscillator circuit for generating local oscillator signals according to the above described method, as well as a satellite-based repeater system comprising a frequency converter and such a local oscillator circuit. dr

DETAILED DESCRIPTION

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as to not obscure the description of the present invention with unnecessary detail.

Figure 1:
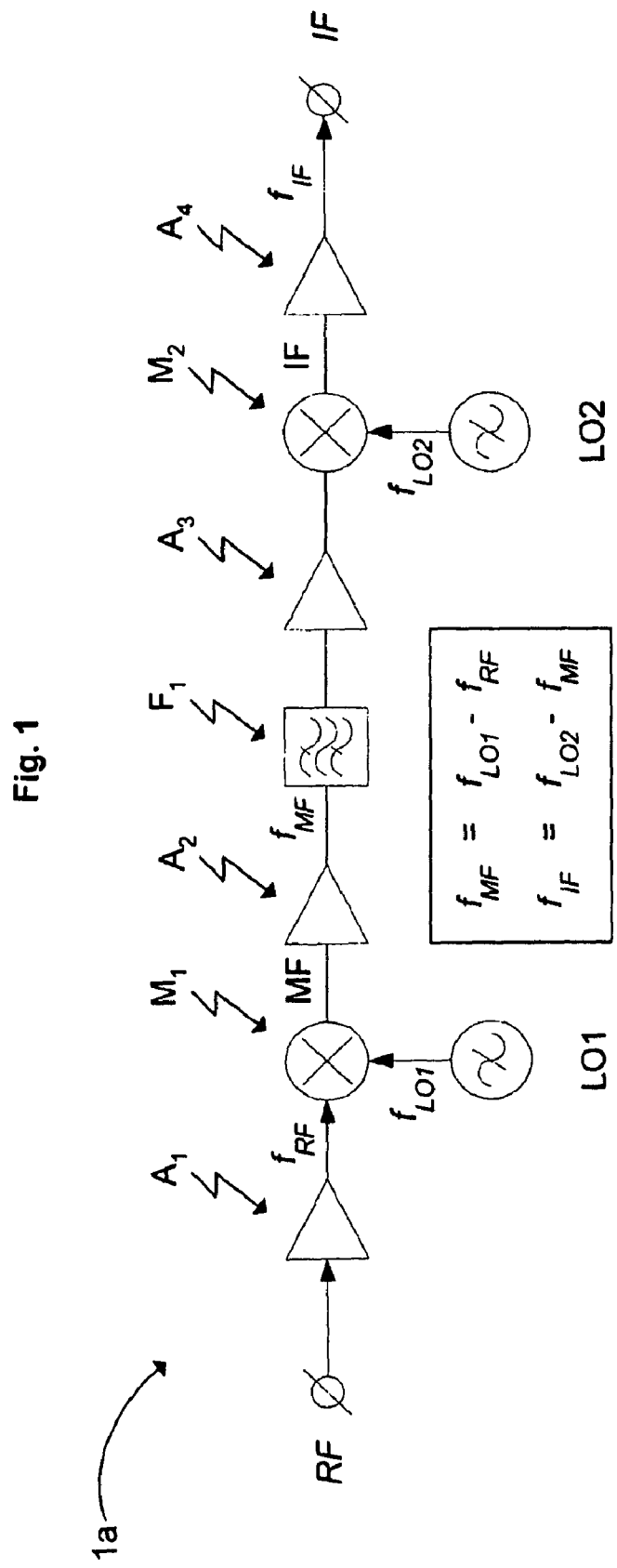
FIG. 1 illustrates a simplified, schematic scheme of a frequency converter for block conversion or single channel conversion utilizing dual frequency conversion with frequency inversion in both conversion stages according to the invention.

FIG. 1 illustrates a simplified, schematic scheme of an exemplary frequency converter $1a$ according to the present invention for use in, for example, a satellite-based repeater system. The frequency converter $1a$ utilizes dual frequency conversion with frequency inversion in both conversion stages.

The frequency converter $1a$ is arranged to receive an uplink radio frequency signal RF which may comprise a single frequency channel or a block of frequency channels. Typically, the uplink signal RF is transmitted from a ground-based transmitter and comprises signals having a frequency between 13,75 and 14,5 GHz. The frequency or frequencies of the uplink signal RF will henceforth be referred to as $f_{RF}$. The received input signal RF may be filtered by a bandpass filter or the like (not shown) and additionally amplified by a first amplifier $A_1$, such as a conventional low noise amplifier. The uplink signal RF is then provided to a first mixer $M_1$ at a first conversion stage where the uplink signal RF is mixed with a first local oscillator signal LO1, which preferably is generated by a circuitry further described below, and down-converted to an intermediate signal MF having a frequency or frequencies $f_{MF}$. The low-frequency intermediate signal MF is then processed in a desired manner. In this particular embodiment, the intermediate signal MF is being amplified by a second amplifier $A_2$, and filtered by a filter $F_1$, such as a suitable bandpass filter, before once again being amplified by a third amplifier $A_3$. After being processed, the intermediate signal MF is provided to a second mixer $M_2$ at a second conversion stage in which the intermediate signal MF is mixed with a second local oscillator signal LO2 to be up-converted to a downlink signal IF having a frequency or frequencies $f_{IF}$, typically within the frequency range 10,7-12, 75 GHz. The downlink signal IF may then be amplified by a high-power amplifier $A_4$ and re-transmitted to a ground receiver.

According to the present invention, the above described frequency converter $1a$ utilizes the technique of frequency inversion in both the first and the second conversion stage. That is, the local oscillator signals (LO signals) LO1 and LO2 are both of a higher frequency than the frequencies of the uplink signal RF and the downlink signal IF. The wanted mixing products are hence:

$$f_{MF}=f_{LO1}-f_{RF}$$

$$f_{IF}=f_{LO2}-f_{MF}$$

And the frequency relations are thus:

$$f_{LO1} \text{ and } f_{LO2} > f_{RF} \text{ and } f_{IF}$$

$$f_{MF} < f_{RF} \text{ and } f_{IF}$$

The benefit of this approach is that all unwanted spurious signals that are harmonics of the LO signals (i.e. $1 \times f_{LO1,2}$, $2 \times f_{LO1,2}$, $3 \times f_{LO1,2}$ etc.) will be of higher frequency than either of the uplink signal RF and the downlink signal IF, and, if needed, they can rejected by a simple low pass filter. Hence the frequency converter 1 utilizing a dual conversion scheme with frequency inversion in both stages according to the present invention is spurious free with respect to LO harmonics.

Besides LO harmonics, other spurious signals are generated as a result of the first mixing process. These spurious signals have a frequency $f_{SPUR}$ that is of the form:

$$f_{SPUR}=|\pm m \times f_{RF} \pm n \times f_{LO1}|$$

where m and n are arbitrary integers.

Considering a dual conversion scheme, it is also important to take into account spurious signals that are generated in the second mixing stage as well. Here:

$$f_{SPUR}=|\pm m \times f_{MF} \pm n \times f_{LO2}|$$

where m and n are arbitrary integers.

It should be noted that the products with m=−1 and n=1, are not spurious signals, but correspond to the wanted intermediate signal MF and the wanted downlink signal IF, respectively.

By proper selection of the LO frequencies $f_{LO1}$ and $f_{LO2}$, and hence $f_{MF}$, it is possible to avoid having spurious products corresponding to |m|=1 and |m|=2 falling within the operating bandwidths. Spurious products with |m|≧3 are not considered to be harmful since the power level of such products is too low to cause any damage or deterioration of the established communication links.

Figure 2:
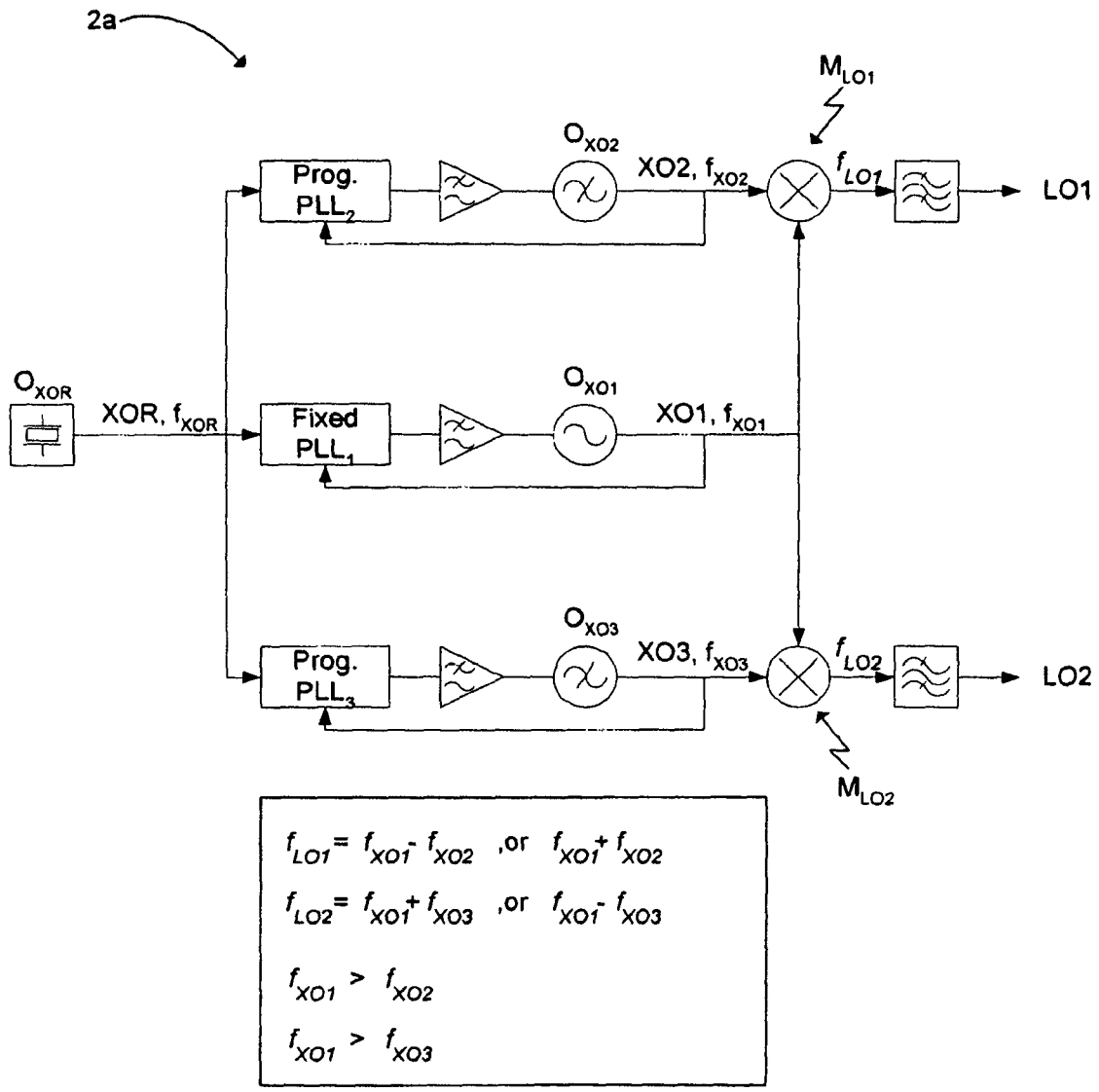
FIG. 2 illustrates the principles of a local oscillator circuit for generating local oscillator signals suitable to use in the frequency converter illustrated in FIG. 1.

With reference now made to FIG. 2, the principles of an exemplary local oscillator circuit 2a for generating spurious-free LO signals with low phase noise suitable for use in the frequency converter scheme of FIG. 1 is shown.

The local oscillator 2a comprises a low frequency source $O_{XOR}$ generating a signal XOR with frequency $f_{XOR}$. Such a source may be realized as a crystal oscillator or similar, but most important is that the source $O_{XOR}$ is a stable oscillator source having a low phase noise. The local oscillator 2a also comprises a fixed high frequency source $O_{XO1}$ of frequency $f_{XO1}$, which is phase and frequency locked to $f_{XOR}$ by means of a fixed phase-locked loop (PLL) circuit $PLL_1$. With known techniques, the high frequency source $O_{XO1}$ can be made to have very low phase noise outside the bandwidth of the fixed phase-locked loop $PLL_1$, and the corresponding bandwidth can be made very small for the oscillator $O_{XO1}$ due to the fixed frequency. The local oscillator 2a further comprises two independent synthesized microwave oscillators, $O_{XO2}$ and $O_{XO3}$. These oscillators $O_{XO2}, O_{XO3}$ are preferably phase and frequency locked to the frequency $f_{XOR}$ of the low frequency source $O_{XOR}$ by means of a first $PLL_2$ and a second $PLL_3$ programmable phase-locked loop, respectively. However, the principle works also for those cases when the synthesized oscillators $O_{XO2}, O_{XO3}$ are phase locked to any source beside $O_{XOR}$ but the overall phase noise will be somewhat degraded for those cases.

It is important to select the frequency $f_{XO1}$ to be higher than $f_{XO2}$ and $f_{XO3}$, and selecting $f_{XO2}$ and $f_{XO3}$ to be of approximately the same frequency. Both $O_{XO2}$ and $O_{XO3}$ need to have loop bandwidths that are greater than the loop bandwidth of $O_{XO1}$, and they will degrade the phase noise performance unless they are made sufficiently low in frequency.

During operation the low frequency signal XOR generated by the low frequency source $O_{XOR}$ is provided as input signal to the first $PLL_1$, second $PLL_2$ and third $PLL_3$ phase-locked loops. The desired local oscillator signals LO1 and LO2 are then realized by mixing the output signal XO1 from the fixed phase-locked loop $PLL_1$ with the output signals XO2 and XO3 from the programmable phase-locked loops $PLL_2$ and $PLL_3$, respectively. As is seen in FIG. 2, the output XO1 from the fixed phase-locked loop $PLL_1$ is mixed with the output XO2 from the first programmable phase-locked loop $PLL_2$ in a first mixer $M_{LO1}$ to generate the local oscillator signal LO1, and with the output XO3 from the second programmable phase-locked loop $PLL_3$ in a second mixer $M_{LO2}$ to generate the local oscillator signal LO2. The local oscillator signals LO1 and LO2 are preferably filtered and then provided to the first and the second conversion stage, respectively, in the frequency converter 1 shown in FIG. 1.

The wanted LO frequencies, $f_{LO1}$ and $f_{LO2}$, are hence realized by mixing XO1 with XO2 and XO3 according to:

$$f_{LO1}=f_{XO1}\pm f_{XO2}$$

$$f_{LO2}=f_{XO1}\pm f_{XO3}$$

The choice of using either the sum or difference frequency in the expressions for $f_{LO1}$ and $f_{LO2}$ has to be determined from case to case. The choice is dependent on the frequencies of the uplink signal RF and the downlink signal IF.

The generated LO frequencies LO1 and LO2, will each have a phase noise that consists of contributions from the high frequency oscillator $O_{XO1}$, and from the two low frequency oscillators $O_{XO2}$ and $O_{XO3}$. By employing the dual conversion scheme according to the present invention, it is possible to cancel out most of the phase noise from LO1 and LO2, since they contain correlated phase noise. The residual phase noise will almost equal the phase noise from a single conversion approach using one local oscillator, LO (i.e. $f_{LO}=|f_{LO1}-f_{LO2}|$), except for a small contribution that is due to the uncorrelated contribution from the low frequency oscillators $O_{XO2}$ and $O_{XO3}$ (mainly due to the difference in loop bandwidth between these two sources).

The frequency converter 1a and the local oscillator 2a can of course be used in single-channel conversion applications but are primarily intended to be used in block conversion applications. That is, when a block of channels with a certain bandwidth are available at the uplink frequency $f_{RF}$. The complete bandwidth is frequency converted using the above dual conversion scheme, to the downlink frequency IF, using the same bandwidth. Hence the internal relation between the channels (and sub-channels) within said bandwidth is preserved. The output signal IF may then be presented to a conventional payload multiplexer (not shown), such as a filter bank and switches, for filtering each individual channel, whereupon each channel further is amplified for transmission through the transmit antenna.

The proposed frequency converter 1a utilizing LO signals generated by the local oscillator 2a in a dual conversion scheme thus allows the user to change the frequency plan without generating spurious signals that may affect the established link performance. The use of synthesized LOs also allows the user to minimize the number of redundant equipment (for failure protection). This is a consequence of the fact that most payload designs that are used in traditional single conversion equipment consist of several different types of frequency converters, each with a unique LO frequency, and redundant equipment are needed for each of these frequency converter types for failure protection. However, with the use of the proposed solution, it is possible to minimize the number of equipment since the conversion scheme of the present invention is capable of addressing any LO frequency of interest.

Figure 3:
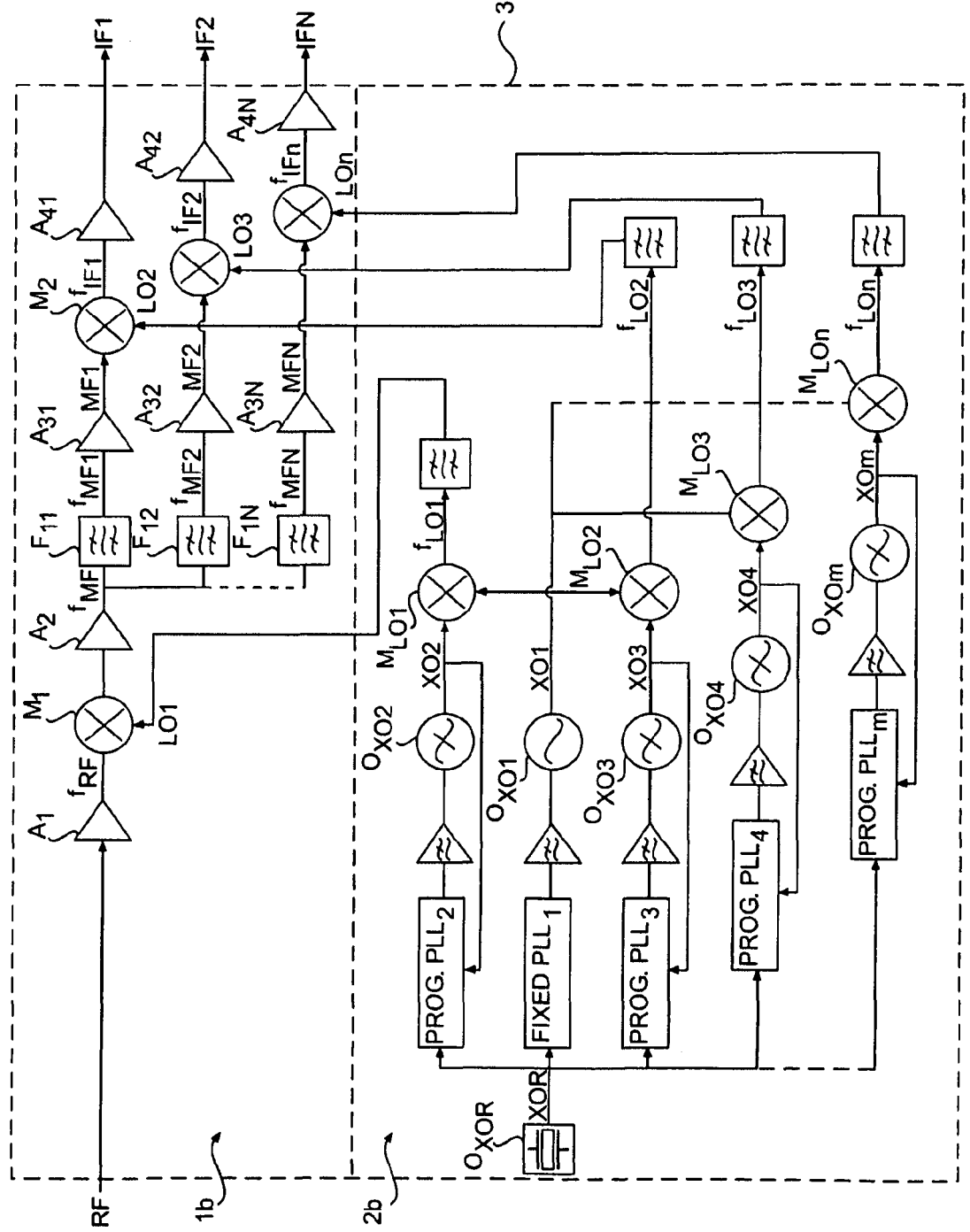
FIG. 3 illustrates a satellite-based repeater system for multi-channel conversion in which the frequency converter and the local oscillator circuit illustrated in FIGS. 1 and 2, respectively, are adjusted to support channelized frequency conversion.

The frequency converter 1a and the local oscillator circuit 2a described above with reference made to FIG. 1 and FIG. 2 thus make up a block conversion circuitry for block conversion applications in a satellite-based repeater system. With reference now made to FIG. 3, the same inventive concept is used for a new type of channel conversion application in a satellite-based repeater system. Here, a slightly adjusted frequency converter 1b and local oscillator circuit 2b make up an exemplary channel conversion circuit 3. The frequency converter 1b and the local oscillator 2b comprise the same type of components as the frequency converter 1a and local oscillator circuit 2a.

As in the block conversion application, this channel conversion application is for those cases when a block of channels with a certain bandwidth are available at the uplink frequency RF. The complete bandwidth is down-converted using the first mixer $M_1$. The output MF from the first mixer $M_1$ is split into N paths, each path going to a separate filter $F_{11}$-$F_{1N}$, wherein N may be any positive integer. The output MF1-N from each filter is up-converted independently to the appropriate downlink frequency $f_{IF1-N}$ by use of a separate local oscillator signal LO1-n.

Hence, this scheme consists of one input stage and N output stages. It is not necessary to include all of these stages (including local oscillators, etc) in one and the same physical entity. On the contrary, it may be beneficial to split the equipment into smaller entities.

The filters $F_{11}$-$F_{1N}$ used can either be of the same bandwidth, or have different bandwidths. The important, and unique feature, is that these filters $F_{11}$-$F_{1N}$ perform the multiplexing function, whereby it is possible to present individual channels (or sets of channels) IF1-IFN at each output from the converter 1b.

In this application it is possible to include the filters $F_{11}$-$F_{1N}$ used for multiplexing of individual channels into the frequency converter 1b. The main benefit of this is that the signal losses otherwise associated with multiplexers and switches is reduced (the synthesized LOs also performs the function of switching). Instead, part of that loss is inserted into the frequency converter 1b between the first and second stage of mixers. This is a location where parameters such as Noise Figure and Linearity (amplitude, phase etc.) can be readily controlled due to the low signal power level used in that location. Also, the outputs MF1-MFN of the filters $F_{11}$-$F_{1N}$ are now reduced in bandwidth, and usually contain only single channel communication, whereby linearity is greatly relaxed. This is particularly important when it comes to multi-carrier/channel applications which require better linearity due to the contribution from more than one carrier.

It is also possible to extend the function of the frequency converter 1b by including the function of the channel amplifier $A_{41}$-$A_{4N}$ at the output of the frequency converter. This extension does not affect the consensus of the proposed solution, but is regarded as something that can be cost effective for this type of applications.

The proposed solution is a novel design. It is aimed both as a replacement of traditional equipment, and as part of a novel payload architecture whereby it is possible to perform multiplexing and channelization in the frequency converter itself. In both cases with enhanced performance and function.

The proposed solution uses a dual conversion scheme with frequency inversion in both conversion stages for spurious free performance, in conjunction with commandable synthesized LOs. The proposed solution includes a novel local oscillator circuitry for optimum phase noise performance.

Satellite payloads can be designed using the inventive concept described herein either in a conventional fashion with the output from the frequency converter 1a being distributed to a multiplexer and channelizer section of the satellite payload, or the payload design can take benefit of the new functionality provided by the channel conversion circuitry 3 of the present invention and include the multiplexer (i.e. filter and switches) as an integral part of a new type of frequency converter 1b. As mentioned above, it is also possible to include the channelizer, i.e. channel amplifier etc, in the same equipment, but this inclusion does not affect any of the technical and functional aspects of the present invention. Especially the latter part scenario allows the payload to be designed in a completely new manner, avoiding many of the limitations experienced with conventional bent-pipe systems using single conversion equipment with fixed LO frequencies.

Although the present invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

It is therefore contemplated that the claims will cover any such modifications or embodiments that fall within the true scope of the invention.

The invention claimed is:

1. A method for frequency conversion within a satellite-based repeater system, the method comprising:
receiving an uplink radio frequency signal having a frequency $f_{RF}$;
generating a first and at least a second local oscillator signal having frequencies $f_{LO1}$ and $f_{LO2}$, respectively;
at a first frequency conversion stage, mixing said uplink signal with said first local oscillator signal to generate an intermediate signal having a frequency $f_{MF}$; and
at a second frequency conversion stage, mixing said intermediate signal with said at least second local oscillator signal to generate a downlink signal having a frequency $f_{IF}$;
wherein the generation and mixing of said signals are performed such that:

$f_{LO1}$ and $f_{LO2} > f_{RF}$ and $f_{IF}$ $f_{MF} = f_{LO1} - f_{RF}$, and $f_{IF} = f_{LO2} - f_{MF}$.

2. The method according to claim 1, wherein
receiving the uplink signal comprises receiving an uplink signal comprising a first block of channels within a certain bandwidth;
mixing said uplink signal with said first local oscillator signal comprises generating an intermediate signal comprising an intermediate block of channels; and
mixing said intermediate signal with said at least second local oscillator signal comprises generating a downlink signal comprising a second block of channels within the same bandwidth and with the same internal relations between the channels as of the input signal.

3. The method according to claim 1, wherein
receiving the uplink signal comprises receiving an uplink signal comprising a first block of channels within a certain bandwidth;
generating the local oscillator signals comprises generating more than two local oscillator signals;
mixing said uplink signal with said first local oscillator signal comprises generating an intermediate signal comprising an intermediate block of channels; and
mixing said intermediate signal with said at least second local oscillator signal comprises splitting the intermediate signal into a plurality of signal paths and filtering the signal in each path with an individually chosen filter ($F_{11-1N}$) to obtain separate intermediate signals having frequencies $f_{MF1-N}$ at the outputs of said filters ($F_{11-1N}$), and mixing each of the separate intermediate signals independently with a separate local oscillator signal to generate a plurality of separate downlink signals.

4. The method according to claim 1, wherein generating the local oscillator signals comprises:
generating a low frequency signal with frequency $f_{XOR}$;
providing the low frequency signal as an input signal to:
a fixed PLL loop comprising a fixed high frequency source of frequency $f_{XO1}$ being phase and frequency locked to $f_{XOR}$;
a first and at least a second programmable PLL loop comprising a first and a second independent synthesized microwave oscillator of frequency $f_{XO2}$ and $f_{XO3}$, respectively, said oscillators being phase and frequency locked to a suitable frequency;
mixing the output signal from the fixed loop with the output signal from the first programmable PLL loop to obtain a first local oscillator signal having a frequency $f_{LO1}=f_{XO1}\pm f_{XO2}$; and
mixing the output signal from the fixed PLL loop with the output signal from the at least second programmable PLL loop to obtain at least a second local oscillator signal having a frequency $f_{LO2}=f_{XO1}\pm f_{XO3}$.

5. A local oscillator circuit for generating local oscillator signals, comprising:
a low frequency source for generating a low frequency signal;
a fixed PLL loop comprising a fixed high frequency source, said fixed PLL loop being arranged to receive the signal from the low frequency source as input and said fixed high frequency source being phase and frequency locked to the frequency of the received signal;
a first and at least a second programmable PLL loop comprising a first and a second independent synthesized microwave oscillator, respectively, said first and at least second programmable PLL loop being arranged to receive the signal from the low frequency source as input, and said independent synthesized oscillators being phase and frequency locked to a suitable frequency;
a mixer arranged to receive the outputs from the fixed PLL loop, the first programmable PLL loop, and the at least second programmable PLL loop and mix the output from said fixed PLL loop with the outputs from the at least two programmable PLL loops to generate at least two local oscillator signals, and
connection circuitry arranged to connect said local oscillator circuit to a frequency converter and to provide one of said local oscillator signals as input to a first down-conversion stage in said frequency converter, and to provide the at least second local oscillator signal as input to a second up-conversion stage in said frequency converter.

6. A satellite-based repeater system, comprising:
a frequency converter arranged to receive an uplink radio frequency signal, said frequency converter comprises:
a first mixer arranged to receive the uplink signal and a first local oscillator signal as input signals, and output an intermediate signal as the difference between the first local oscillator signal and the uplink signal; and
at least a second mixer arranged to receive the processed intermediate signal and at least a second local oscillator signal as input signals, and output at least one downlink signal as the difference between the at least second local oscillator signal and the intermediate signal, and
a local oscillator circuit according to claim 5 for generating said at least two local oscillator signals.

* * * * *